(12) United States Patent  
LaBerge

(10) Patent No.: US 7,673,094 B2
(45) Date of Patent: *Mar. 2, 2010

(54) MEMORY DEVICES WITH BUFFERED COMMAND ADDRESS BUS

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 91 days.

This patent is subject to a terminal disclaimer.

(21) Appl. No.: 11/592,944

(22) Filed: Nov. 3, 2006

(65) Prior Publication Data

US 2007/0079049 A1    Apr. 5, 2007

Related U.S. Application Data

(63) Continuation of application No. 10/405,257, filed on Mar. 31, 2003, now Pat. No. 7,149,841.

(51) Int. Cl.
*G06F 12/00* (2006.01)

(52) U.S. Cl. .................. 711/5; 711/105; 711/167
(58) Field of Classification Search .......... 711/5, 711/105, 167
See application file for complete search history.

(56) References Cited

U.S. PATENT DOCUMENTS

| 5,216,637 | A | | 6/1993 | Vaillancourt |
| 5,680,342 | A | | 10/1997 | Frankeny |
| 5,819,076 | A | * | 10/1998 | Jeddeloh et al. ............. 713/401 |
| 6,011,710 | A | | 1/2000 | Wiggers |
| 6,070,217 | A | | 5/2000 | Connolly et al. |
| 6,115,278 | A | | 9/2000 | Deneroff et al. |
| 6,166,988 | A | | 12/2000 | Ryu et al. |
| 6,222,407 | B1 | * | 4/2001 | Gregor .................. 327/269 |
| 6,229,748 | B1 | | 5/2001 | Ryu et al. |
| 6,292,877 | B1 | | 9/2001 | Ryan |
| 6,326,973 | B1 | * | 12/2001 | Behrbaum et al. .......... 345/532 |
| 6,349,357 | B1 | | 2/2002 | Chong, Jr. |
| 6,453,402 | B1 | * | 9/2002 | Jeddeloh ................. 711/167 |
| 6,487,102 | B1 | | 11/2002 | Halbert et al. |
| 6,526,473 | B1 | | 2/2003 | Kim |
| 6,530,033 | B1 | | 3/2003 | Raynham et al. |

(Continued)

OTHER PUBLICATIONS

Bus Switches for Speed, Safety, and Efficiency: What They Are and What You Should Know about Them, by Eva Murphy, published, Nov. 6, 2002, pp. 1-4. (http://www.analog.com/library/analogDialogue/archives/36-06/bus_switch/index.html).*

*Primary Examiner*—Sheng-Jen Tsai
*Assistant Examiner*—Kaushikkumar Patel
(74) *Attorney, Agent, or Firm*—Ropes & Gray LLP; Jeffrey H. Ingerman; Gall C. Gotfried

(57) ABSTRACT

Circuits and methods are provided that alleviate overloading of the command address bus and limit decreases in command address bus bandwidth to allow increased numbers of memory modules to be included in a computer system. A plurality of switches is coupled between the command address bus (which is coupled to the memory controller) and a respective plurality of memory modules. Each switch provides command address bus data only to its respective memory module. Preferably, only one switch does so at a time, limiting the loading seen by the memory controller.

41 Claims, 10 Drawing Sheets

U.S. PATENT DOCUMENTS

| | | |
|---|---|---|
| 6,535,450 B1 | 3/2003 | Ryan et al. |
| 6,553,472 B2 * | 4/2003 | Yang et al. .................. 711/167 |
| 6,587,363 B2 | 7/2003 | Klein |
| 6,906,960 B2 | 6/2005 | Saito et al. |
| 7,047,371 B2 | 5/2006 | Dortu |
| 2002/0138686 A1 * | 9/2002 | Yang et al. .................. 711/105 |

* cited by examiner

MEMORY DEVICES WITH BUFFERED COMMAND ADDRESS BUS

This application is a continuation of U.S. patent application Ser. No. 10/405,257, filed Mar. 31, 2003 which is hereby incorporated by reference in its entirety.

BACKGROUND OF THE INVENTION

This invention relates to memory modules having multiple memory devices. More particularly, this invention relates to memory modules having multiple memory devices with reduced signal loading at the devices' interface.

Computer systems are often designed to provide flexible memory resources (e.g., 512 megabytes, 1.2 gigabytes, etc.), and these memory resources can be designed with different combinations of memory modules, memory devices, or both. For example, the memory capacity of a computer system can be made up of one or more DRAM (dynamic random access memory) based memory modules. If a system's memory comprises two memory modules of equal size, each module represents half the system's memory capacity. One memory module can represent the "lower" half of the computer system's memory, and the other can represent the "upper" half. Alternatively, every other n-bytes of data can be stored in one memory module, while the remaining n-bytes of data can be stored in the other memory module.

Each memory module can include more than one rank of memory devices. Each rank of memory devices can include one or more memory devices that store data for a range of addresses in the computer system's memory and is individually selectable with a chip select signal. In addition, each DRAM-based memory device can be organized into internal banks and rows which have to be activated (or "opened") before read or write accesses can occur. Typically, only one row (or "page") in a particular internal bank of a DRAM-based memory device can be open at one time. However, more than one internal bank of such a memory device can be open at one time. Before another row in the same internal bank can be opened, the row currently open has to be closed. Banks and rows of DRAM-based memory devices are activated by commands received from a memory controller over a command address bus.

Inefficiencies in DRAM-based memory devices arise when successive accesses are made to different rows in the same internal bank. Such accesses cause the currently open row to be closed before a different row can be opened, thus delaying the access. One way to minimize these inefficiencies is to close a row as soon as it has been accessed rather than leaving it open. Then, no unnecessary delay (i.e., row de-activation time) is incurred when a subsequent access is to another row. However, closing rows immediately after access can still result in an unnecessary delay should the next access be to the same row (because now that same row has to be re-opened).

More than one rank of memory devices also can be open at the same time. Thus, having as many ranks of memory as possible constitute the memory resources of a computer system is advantageous because many different internal banks and rows on different memory devices (or memory modules) can be open concurrently. Accordingly, memory modules made up of multiple ranks, each of which can be accessed independently, are commonly used. Examples of memory modules that include multiple ranks are double-sided DIMMs (dual in-line memory modules), which include at least one rank of memory devices on each side of the DIMM.

Typically, the interface between memory modules and memory controller includes a command bus, an address bus, a data bus, and other control signal lines. Because multi-rank memory modules include memory devices connected in parallel, a potentially large number of memory devices use the same signals, which can result in electrical overloading of the interface between the memory controller and the memory modules. Moreover, each rank of memory devices is individually selected with a corresponding chip select signal. Each chip select signal is also used to establish a window of time during which signals on the command bus and the address bus (hereinafter referred to as the "command address bus") are valid. As the number of ranks of memory devices in a computer system increases, more time may be needed to ensure that signal degradation of chip select signals and signals on the command address bus does not affect operation of the memory modules.

One approach to alleviating overloaded interface connections between parallel-connected memory devices is to provide duplicate signals from the memory controller to each device. Although this alleviates overloading of connections, duplication is not an economical solution for the large number of connections between a memory controller and each memory module because the memory controller will require more external pins.

Another approach to alleviating overloaded memory interface connections is to buffer the command address bus between the memory controller and the memory modules. However, buffering on the memory module is expensive and requires an extra clock of latency.

Yet another approach to minimizing the effects of an overloaded command address bus (and to maximizing the number of memory modules connectable to a memory controller) is to present the address to the memory two clock cycles in a row, with the chip select signal inactive for the first cycle and active for the second cycle. This provides an extra clock cycle of setup time to the memory devices. The chip select signal still runs in the same manner (i.e., active for only one clock cycle), but the chip select signal is only driven to one module (or rank), so loading is not a problem. This solution is called "2T" addressing. However, 2T addressing diminishes command address bus bandwidth because for every command issued to the memory devices, an extra clock cycle is required. Therefore, for memory devices that can accept signals from a command address bus at maximum speed, 2T addressing reduces memory bandwidth.

In view of the foregoing, it would be desirable to be able to increase the number of memory modules and the number of ranks of memory devices connectable to a memory controller by alleviating the overloading of the command address bus while limiting any decrease in command address bus bandwidth.

SUMMARY OF THE INVENTION

It is an object of this invention to increase the number of memory modules and the number of ranks of memory devices connectable to a memory controller by alleviating the overloading of the command address bus while limiting any decrease in command address bus bandwidth.

In accordance with the invention, switches are provided between a memory controller and the memory modules. The switches isolate the command address bus from the memory modules. The command address bus is coupled to the memory controller and the switches. The memory controller also provides preferably multiple copies of chip select signals that can be used to enable/disable the switches. The switches can be advantageously implemented either on the memory modules or elsewhere between the memory modules and memory controller. The signal propagation delay through the switches is insignificant compared to the extra clock cycle required by buffering or 2T addressing.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

SDRAM-based memory modules (including DDR (double data rate) SDRAM-based devices) and other types of memory modules that have multiple ranks advantageously can increase memory access throughput by having many activated internal banks and rows in each rank. Memory access schemes are known and can be developed that take advantage of this parallel activation of more than one rank of memory devices.

However, because a high number of ranks of memory devices can result in signal degradation on the command address bus shared between these ranks, the command address bus is advantageously connected to switches between the memory controller and the memory modules in accordance with the invention. The switches electrically isolate the command address bus from the ranks of memory devices. Each rank can be individually selected using a corresponding chip select signal, which also can be used to control the switches. Electrical overloading of the command address bus is reduced because the command address bus is preferably driven to one rank of memory devices at a time.

Figure 1:
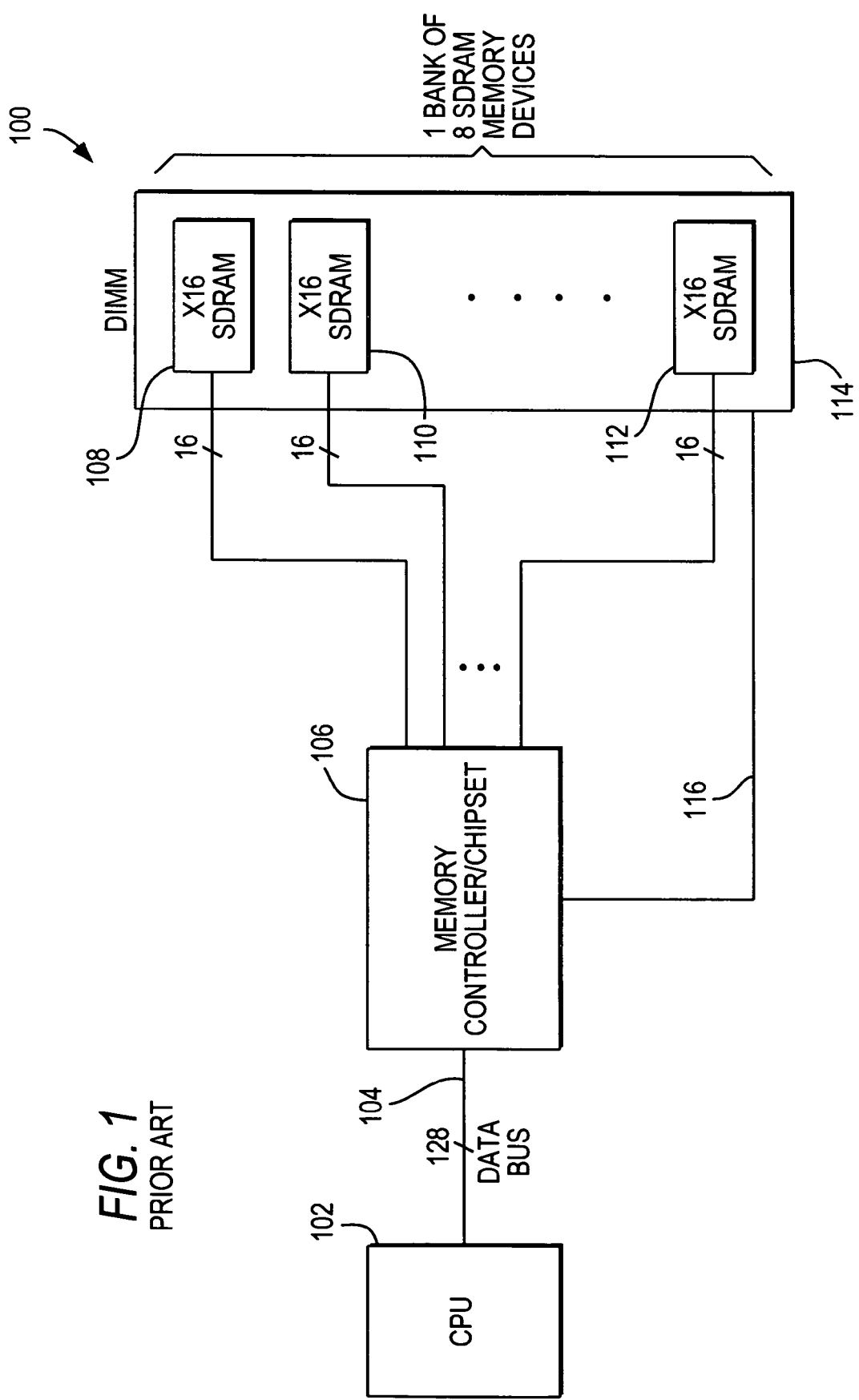
FIG. 1 is a block diagram of a typical computer system that includes memory modules.

FIG. 1 illustrates a typical computer system 100. Computer system 100 includes CPU (central processing unit) 102 coupled to DIMM 114 via memory controller 106. Memory controller 106 can be implemented on an integrated circuit (e.g., a chipset) that includes other functions or can be implemented on the same integrated circuit as CPU 102. DIMM 114 has eight SDRAM devices, each of which are organized to store 16-bit data (note that the eight SDRAM devices are merely illustrative; computer systems may incorporate memory modules having other numbers and types of memory devices (such as, e.g., double data rate SDRAMs)). Each SDRAM memory device (e.g., memory devices 108, 110, and 112) is connected in parallel to memory controller 106 via a respective 16-bit data bus. Typically, all SDRAM memory devices are selected simultaneously for reading and writing by memory controller 106. If all eight memory devices are accessed at the same time, 128 bits of data can be written or read at the same time by CPU 102. This group of eight memory devices constitutes one rank of memory devices. Another rank of memory devices can be coupled in parallel, and selected simultaneously by memory controller 106. One way of adding an additional rank of memory devices is to have one rank on one side of DIMM 114 and another rank on the other side of DIMM 114. Command address bus 116 is coupled to DIMM 114 and is distributed to each memory device on the DIMM.

Figure 2:
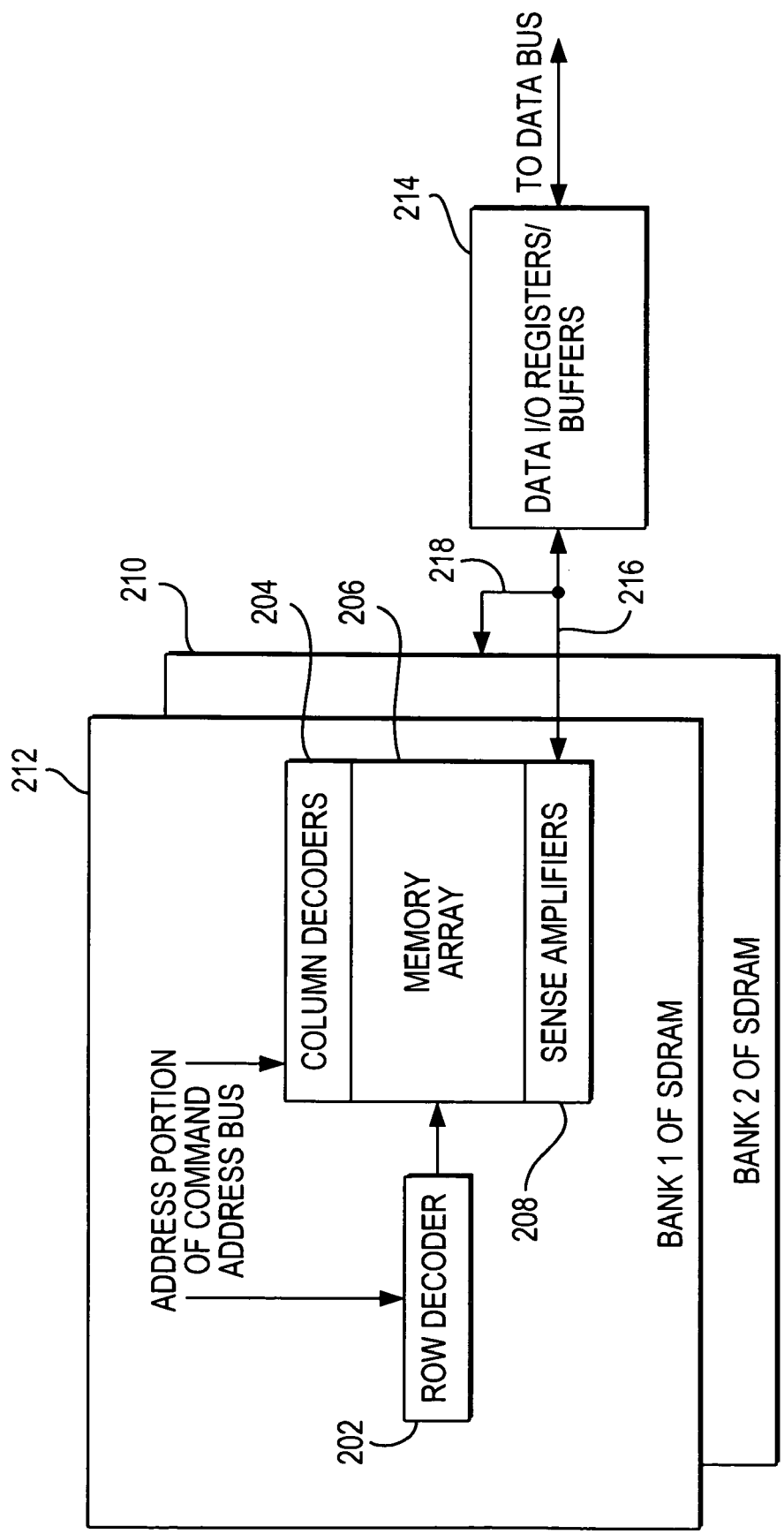
FIG. 2 is a block diagram of a typical SDRAM (synchronous dynamic random access memory) device.

FIG. 2 shows a typical dual-bank SDRAM device. An SDRAM device can be organized into multiple memory arrays or internal banks, each having circuitry to address its corresponding memory storage. For example, the first internal bank of an SDRAM device (e.g., bank 212) includes memory array 206 which is organized into rows and columns of memory cells. To access the memory cells in a particular row and column of memory array 206, the row address is provided to bank 212 and decoded by row decoder 202, followed by a column address and subsequent decoding by column decoder 204. On read accesses, data is provided by memory array 206 to data input/output (I/O) registers/buffers 214 through sense amplifiers 208. On write accesses, data is provided to memory array 206 by I/O registers/buffers 214 through sense amplifiers 208. Each bank of an SDRAM device preferably includes at least the circuitry shown for bank 212, and is thus accessible in this manner independent of other internal banks. Each internal bank of an SDRAM device is connected to the same portion of the data bus from the memory controller for a 16-bit SDRAM device, the banks in the device are connected to the same 16-bit portion of the data bus). This is illustrated in FIG. 2 by the parallel connection (via busses 216 and 218) of both banks to data I/O registers/buffers 214. The memory controller can be configured to advantageously coordinate bank selection. For example, another bank can be made ready for access (e.g., bank activation, row selection, column selection) while the memory controller is still writing or reading data to or from the other bank.

Figure 3:
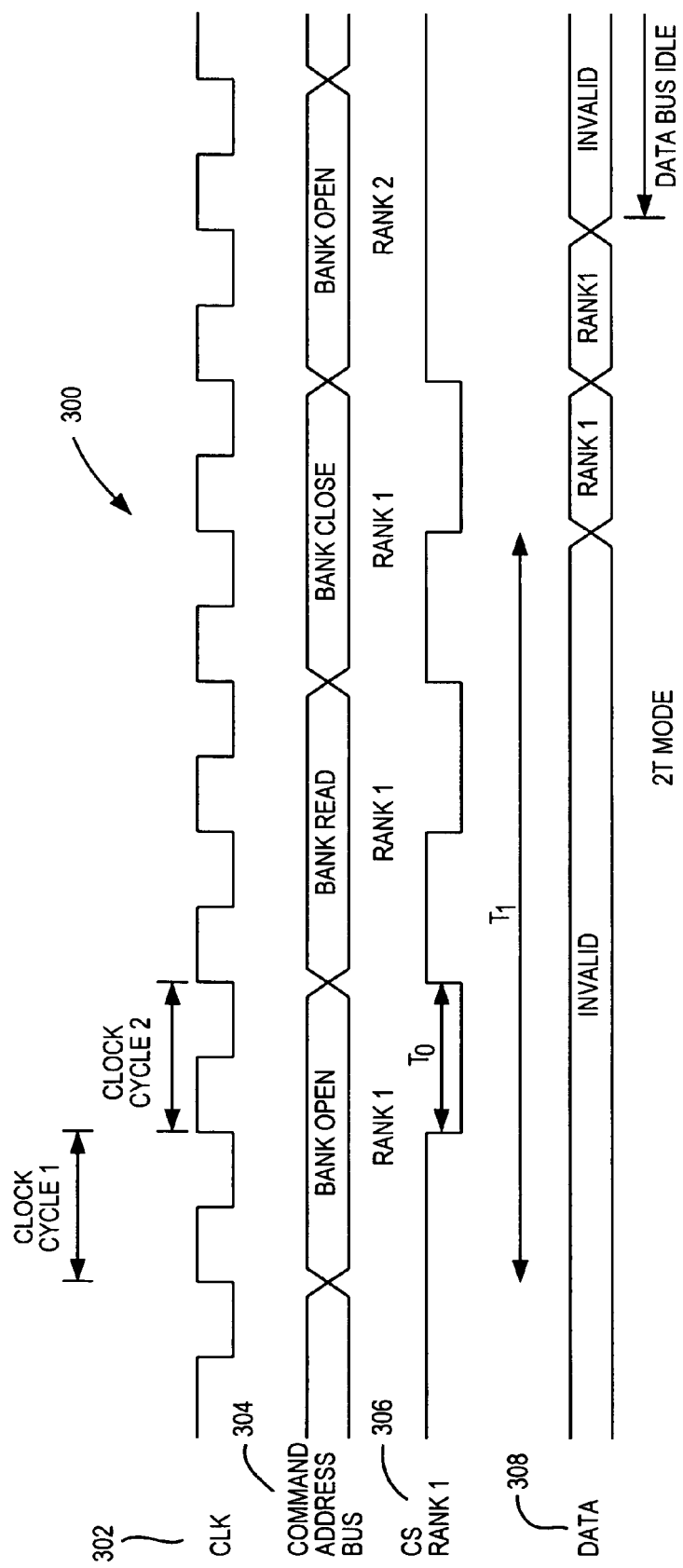
FIG. 3 is a timing diagram of signals between a memory controller and memory modules.

FIG. 3 illustrates typical command address bus timing for a DRAM-based DIMM. Clock signal CLK 302 synchronizes chip select signal CS 306 and command address bus 304. When chip select signal CS 306 is low, signals on command address bus 304 are considered valid by the DIMM. If the memory controller is operated in 2T addressing mode, chip select signal CS 306 is low for one cycle (e.g., $T_0$), while the command address bus signals are held valid for two clock cycles. By keeping the command address bus signals valid for two clock cycles, the setup time of the command address bus signals relative to the rising edge of the clock signal is increased. The chip select signal is synchronized to the same clock signal as the command address bus signals. However, the chip select signal does not have to be held valid for two clock cycles because each chip select signal drives only one rank of memory devices, and thus has a smaller load than the command address bus signals. Thus, the command address bus is given time to settle before the chip select signal indicates that a command is being issued on the command address bus. As shown in timing diagram 300, DIMMs operating in 2T addressing mode may slow down memory accesses because at least one extra clock cycle is used every time a command is sent to the DIMM. Moreover, a typical access in a typical DRAM-based DIMM may require the issuance of more than one command. For example, the memory controller activates (or opens) an internal bank and row before the row can be accessed, and the memory controller may be required to close the row after each access. In accordance with the invention, the memory controller can be advantageously operated in "1T" addressing mode (i.e., command address bus signals are held active for preferably one clock cycle to indicate a valid command).

FIG. 3 also shows data bus 308, which provides data from the selected rank of memory devices. For example, as shown in FIG. 3, rank 1 of the memory devices can respond by providing data on data bus 308 after time interval $T_1$ from the beginning of a bank open command issued to rank 1. Time interval $T_1$ is determined by the amount of time needed by the memory devices to respond to bank open and bank read commands. Time interval $T_1$ is also affected by pending commands to other banks in the same rank or other ranks, because the same data bus can be shared between several ranks of memory devices and other types of memory devices. FIG. 3 shows a memory access to rank 1 with a burst length of two (i.e., the memory controller has requested two words of data). After rank 1 has provided the data requested by the memory controller, data bus 308 is idle (e.g., tristated). The idle time of data bus 308 depends on the following: the amount of time needed to issue a command to a memory device, the response time of the memory devices, and the burst length of data requested from rank 1. Because the memory devices are operated in 2T mode, the component of time interval $T_1$ needed to issue a command is increased. In some computer systems, if the burst length of data requested from the memory devices is long, the effect of operating the memory devices in 2T mode is masked because the data bus is kept busy outputting long bursts of data. However, for other computer systems, the data bus remains idle for significant periods of time because the command address bus bandwidth is degraded by the operation of the memory devices in 2T mode. Although FIG. 3 illustrates a read access (the data is provided by the memory devices, and not by the controller), the data bus is potentially idle for long periods of time after a write access. A difference between a write access and a read access is the latency of the data with respect to the command address bus. For a write access, the data can be provided on the address bus at, substantially the same time that the corresponding write command is issued, but a subsequent write access to another rank is delayed by the time required to open a bank and to issue a command, which is greater in 2T mode.

Figure 4:
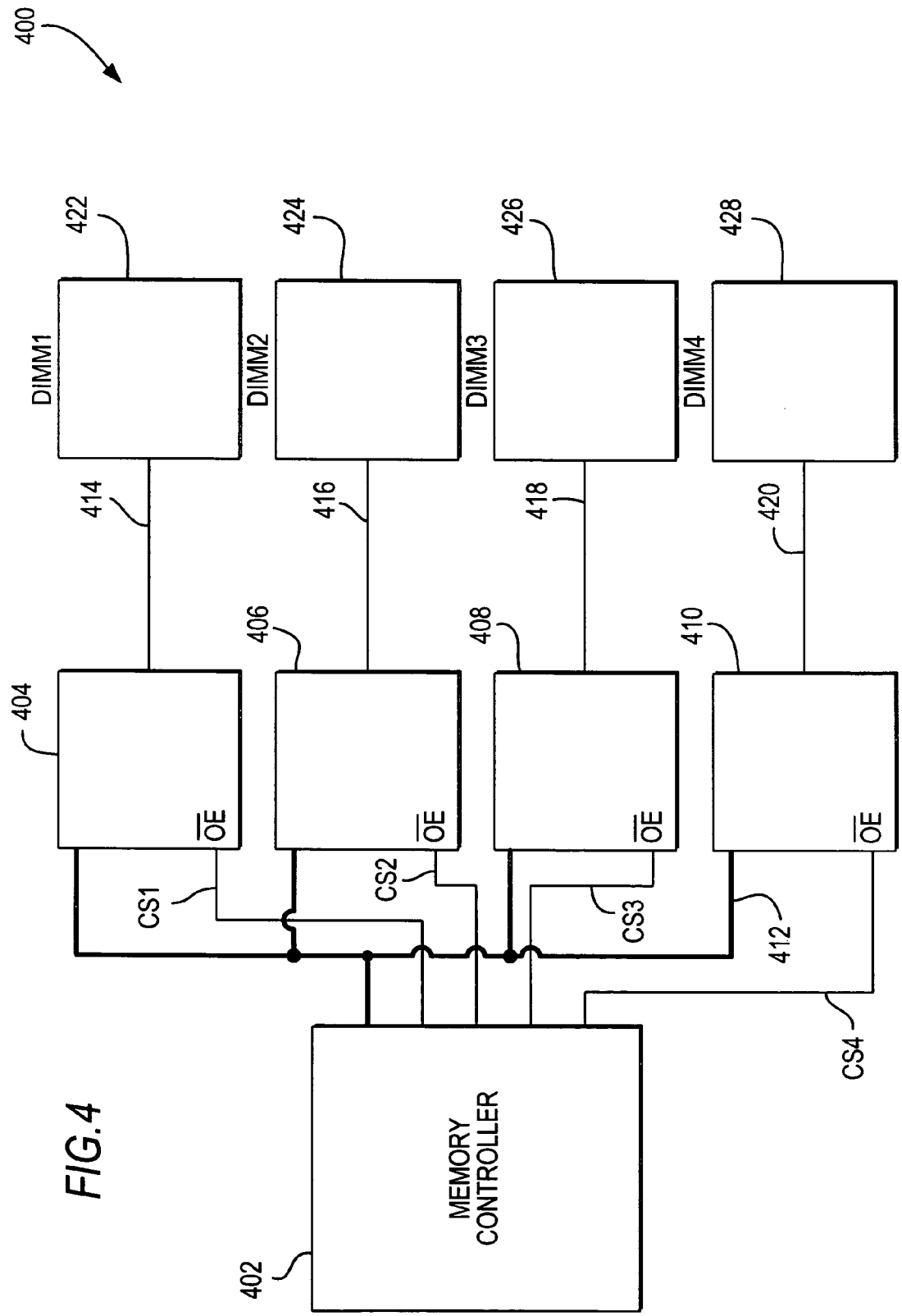
FIG. 4 is block diagram of a memory controller coupled to memory modules according to the invention.

FIG. 4 shows memory configuration 400 in accordance with the invention. Memory configuration 400 includes memory controller 402 coupled to four bus switches 404, 406, 408, and 410. The signal quality of command address bus 412 is improved with the use of these switches because they isolate the command address bus from the memory modules. One type of switch suitable for use in accordance with the invention comprises an N-channel FET (field effect transistor) with low resistance when turned on (i.e., conducting or in the closed state) and high impedance when turned off (i.e., non-conducting or in the open state). However, any type of switch that exhibits low propagation delay and that does not substantially degrade signal quality is suitable for use with the invention.

Switches 404, 406, 408, and 410 isolate portions of the command address bus (i.e., buses 412, 414, 416, 418, and 420) from memory controller 402. Advantageously, command address bus 412 is loaded with only one of DIMMs 422, 424, 426, and 428 at a same time because only one of switches 404, 406, 408, and 410 is preferably turned on at a time. Switches 404, 406, 408, and 410 are controlled by chip select signal CS1, chip select signal CS2, chip select signal CS3, and chip select signal CS4, respectively, each of which is used to select one rank of memory devices. The chip select signals are not shared among ranks, thus it is not necessary for these signals to be isolated using the is same scheme as the command address bus. The chip select signals can be used to drive switches 404, 406, 408, and 410 and DIMMs 422, 424, 426, and 428. Alternatively, the memory controller can provide extra copies of the chip select signals such that one copy is used to control the switches, and the other copy is used to control the DIMMs.

Using switches to isolate the command address bus from each rank of memory devices can introduce a delay between the chip select signal for each rank and signals on the command address bus. But this delay is insignificant compared to the loss of command address bus bandwidth that occurs with 2T addressing. Furthermore, this delay can be compensated for by sending the command address bus signals early or by delaying any strobe or clock signal indicating valid data received from the memory modules.

FIG. 4 also illustrates the logical placement of the switches with respect to the memory controller and the DIMMs. Typically the memory controller is mounted on a motherboard, and the DIMMs are implemented as printed circuit boards that are inserted into sockets on the motherboard. The switches can either be placed on the motherboard or on the DIMM circuit boards.

If DIMMs having more than one rank of memory devices are used, each rank of memory devices still shares the same command address bus if the switches used to isolate the command bus are not located on the DIMMs. When switches are used to couple the command address bus to the DIMMs, the command address bus to a particular DIMM (e.g., bus 414, 416, 418, or 420) is driven only when a rank of memory devices on that DIMM is being selected by its corresponding chip select signal. Thus, when more than one rank of memory devices is present on a DIMM (e.g., double-sided DIMMs), the command address bus has to be driven when either one of the ranks of memory devices is selected by its corresponding chip select signal. In an alternative embodiment, if the switches are implemented on the DIMMs and there is more than one rank of memory devices on a DIMM, the DIMM can include switches to isolate the command address bus for each rank of memory devices, thus eliminating the requirement that the command address bus be shared between two ranks of memory devices.

Figure 5:
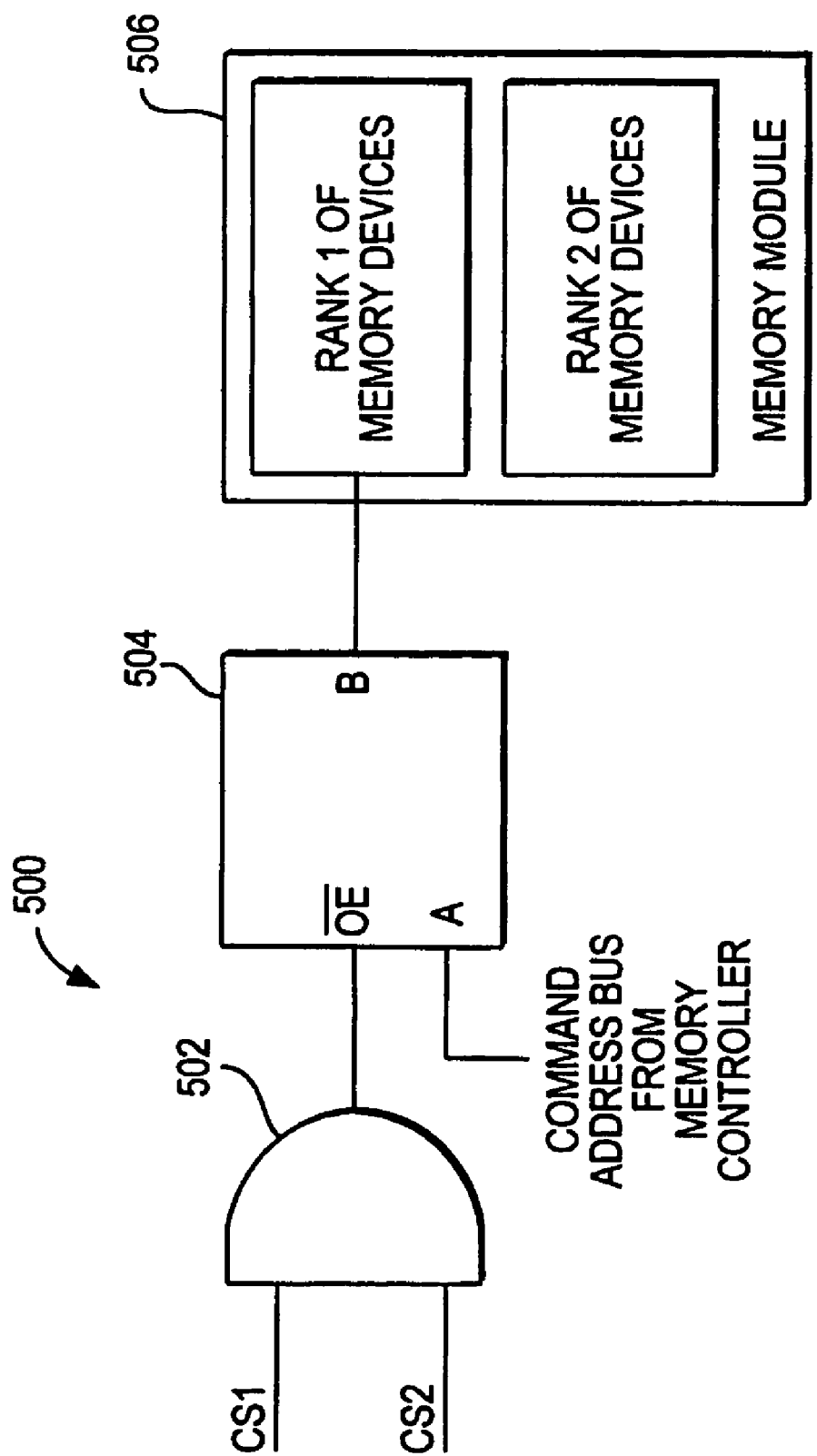
FIG. 5 is a schematic representation of circuitry used to generate switch control signals according to the invention.

FIG. 5 shows one embodiment of the invention in which the chip select signals can be logically combined to control the switches, such that if there is more than one rank of memory devices on a DIMM, the command address bus is driven to the DIMM when any one of the ranks on the DIMM is selected. As shown in FIG. 5, AND gate 502 can be used to combine two chip select signals CS1 and CS2. The output of AND gate 502 can be used to control switch 504 to provide the command address bus to memory module 506, which has one rank of memory devices controlled by CS1 and another rank of memory devices controlled by CS2.

Figure 6:
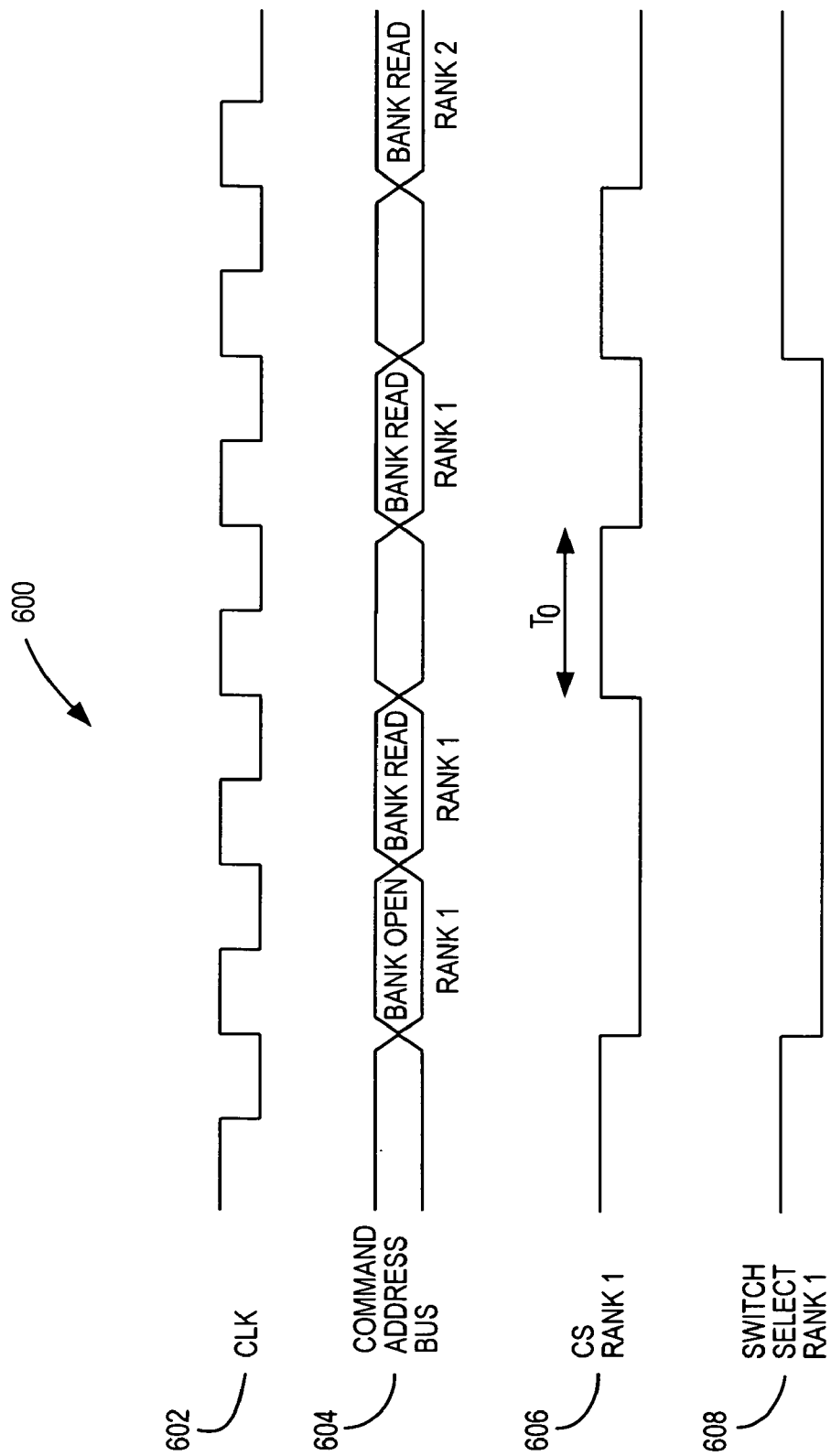
FIG. 6 is a timing diagram of signals between a memory controller, switches, and memory modules according to the invention.

In an embodiment of the invention, the memory controller provides a switch select signal to drive the switch for each memory module, wherein the signal is configured to enable (i.e., close) the switch when either one of the ranks on the memory modules has been selected. This allows the controller to turn the switches on or off independent of the chip select signals, which is advantageous if the switches are noisy or require settling time when activated or de-activated. The timing of the switch select signal can be based on the chip select signals, but does not have to be exactly the same. For example, timing diagram 600 of FIG. 6 shows clock signal CLK 602 (which synchronizes command address bus 604), chip select signal CS 606, and switch select signal 608. Chip select signal CS 606 and switch select signal 608 control the switch for a first rank of memory devices. Because the memory controller has information about memory accesses, the memory controller can output a switch select signal that maintains switch correspondence to a particular rank of enabled memory devices, as long as the memory controller is not accessing another rank of memory devices. For example, as command address bus 604 shows, there are two successive accesses to a first rank of memory devices with no intervening accesses to another rank. Instead of having the switch select signal timing based exclusively on chip select timing, and thus cause the switches corresponding to the first rank to be de-selected during time interval $T_0$, switch select signal 608 is preferably active for the entire period is that the memory controller is exclusively accessing one rank of memory devices.

Other embodiments of the invention can include circuitry to combine more than two chip select signals if mote than two ranks are present on each memory module. Or, a memory controller can be configured to provide switch control signals that indicate the presence of more than two ranks on one memory module.

When switches for one rank of memory devices are turned off and another set of switches are turned on, settling time may be required between turning off the first set of switches and turning on the second set of switches. If no settling time is provided, erroneous signaling of commands may result.

Figure 7:
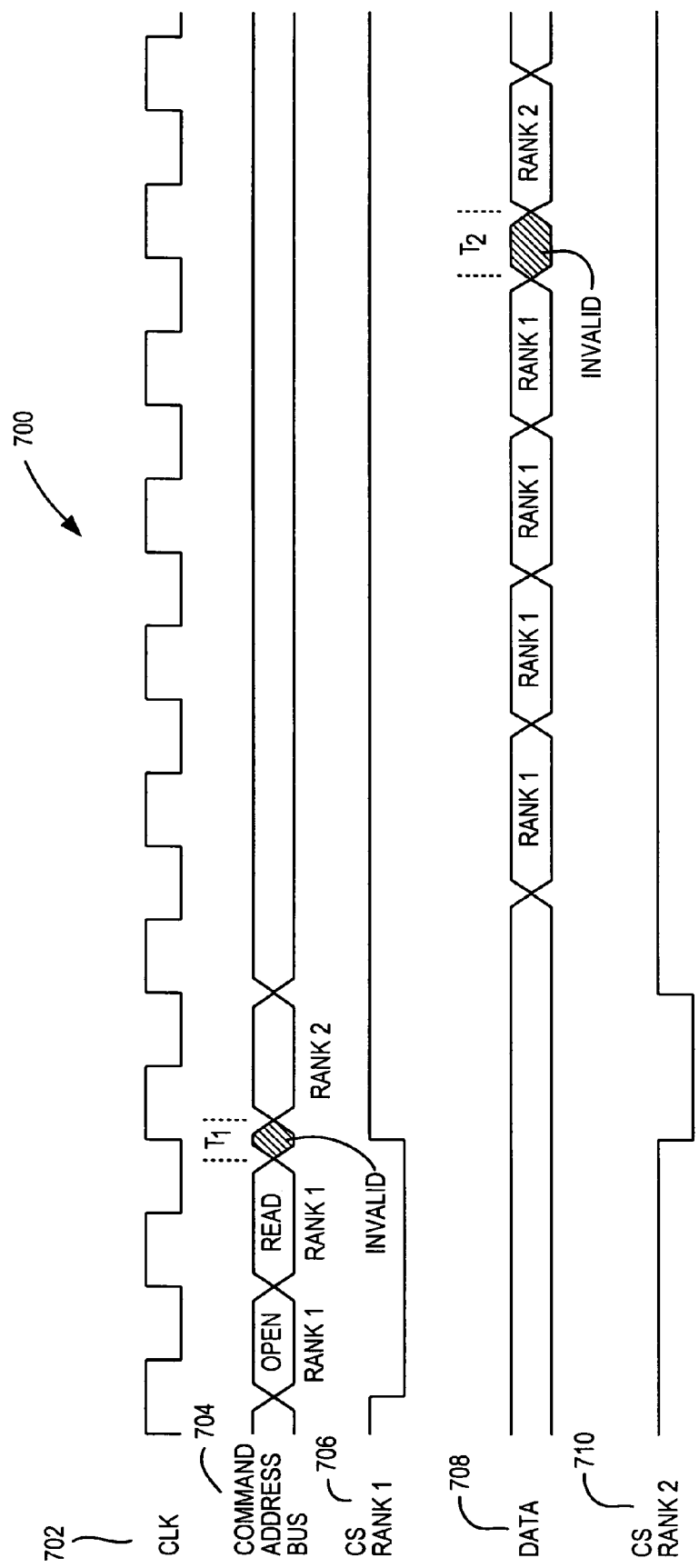
FIG. 7 is a timing diagram of signals between a memory controller and memory modules.

Timing diagram 700 of FIG. 7 illustrates how erroneous signaling of commands could result from providing no settling time between accesses to a first rank of memory devices and accesses to a second rank of memory devices. When a command to a first rank is immediately followed by the issuance of a command to a second rank, command address bus 704 transitions from issuing a command to the first rank to issuing a command to the second rank. There may be a time interval, $T_1$, during which command address bus 704 is invalid because the set of switches driving the first rank is being turned off at approximately the same time that another set of switches driving the second rank is turned on. Therefore, a command to a second rank may not be issued immediately after a command to a first rank. The memory controller preferably waits a clock cycle before issuing commands to a second rank of memory devices after issuing commands to a first rank of memory devices. Although an extra clock cycle can be required between accesses to different ranks, this clock cycle does not significantly impact overall memory throughput on read accesses, because data bus 708 requires a clock cycle (a "turnaround" cycle) between two subsequent read accesses from two different ranks to avoid data from one rank being mistaken for data from another rank. As illustrated in FIG. 7, because data bus 708 is shared between more than one rank of memory devices, during time interval $T_2$, data could be driven by both ranks of devices and thus cause invalid data to be present on data bus 708. Thus, even if at $T_1$ it were possible to avoid inserting a clock cycle of delay between accesses to two different ranks, it would not be possible to accept data from two different ranks without an intervening turnaround cycle on read accesses.

Figure 8:
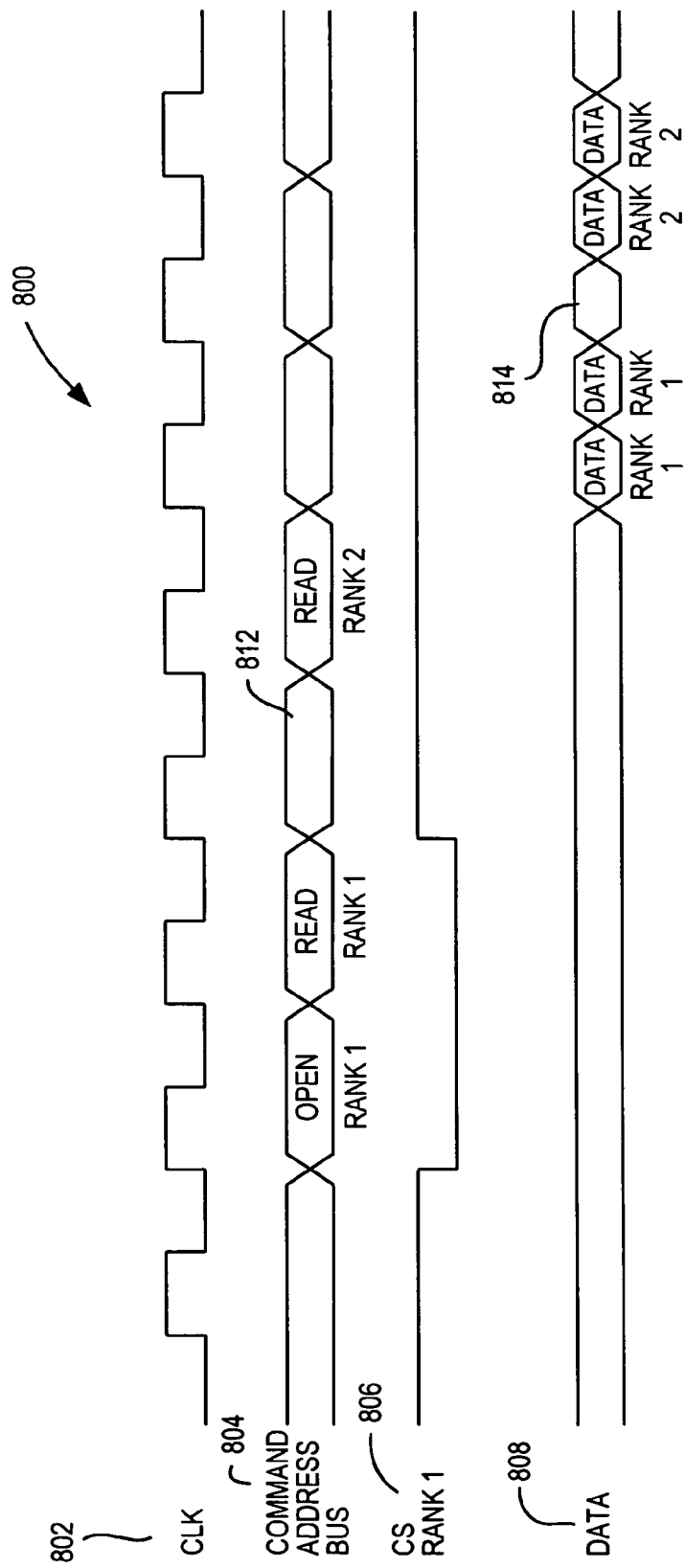
FIG. 8 is a timing diagram of signals also between a memory controller and memory modules.

Timing diagram 800 of FIG. 8 illustrates how the command address bus can be controlled to wait at least a clock cycle in between successive accesses to different ranks of memory devices. As shown in FIG. 8, an open (bank) command is followed by a read command to a first rank of memory devices on command address bus 804. These commands do not require an intervening turnaround clock cycle because the same set of switches is driven when commands are issued to one rank of memory devices. Turnaround clock cycle 812 is provided between the commands issued to the first rank and a subsequent read command to a second rank of devices. Because successive read accesses to different ranks of devices require an additional clock cycle of delay between accesses, the insertion of intervening clock cycle 812 on command address bus 804 does not cause a loss of memory bandwidth. FIG. 8 also illustrates a data output rate of twice the clock speed. Correspondingly, only a half turnaround clock cycle 814 can be inserted between read accesses from two different ranks of data. Although command address bus 804 in FIG. 8 is shown as having a clock cycle of turnaround time, a half clock cycle may suffice for command address bus 804 to settle in some embodiments of the invention. Although FIGS. 7 and 8 illustrate read accesses from ranks of devices, settling time may have to be provided between write accesses to different ranks of memory devices in the same manner illustrated for read accesses from different ranks. However, no corresponding turnaround time is required on the data bus between write accesses to two different ranks of memory devices.

In view of the turnaround time required to settle the command address bus between accesses to different ranks of memory devices, it can be advantageous to schedule together as many commands to one rank of memory devices as possible, without intervening commands to a different rank. One limitation on scheduling commands is the delay required between a bank activation command and bank read/write command. While the bank read/write command can be issued on the command address bus immediately after a bank activation command, the memory device cannot respond to a read/write command if such a command is issued before it is ready. In DRAM devices, the time required between the activation and read/write commands is the $t_{RCD}$ (RAS-to-CAS delay) parameter. One way to do this is by using "posted CAS accesses," which are available for at least DDRII (Double Data Rate II) DRAM devices. In posted CAS accesses, the read/write command to a particular bank (in a rank) can be delayed at the memory device internally after the receipt of the read/write command with the use of a buffer inside the memory device that holds the read/write commands until the memory device is ready to respond.

Figure 9:
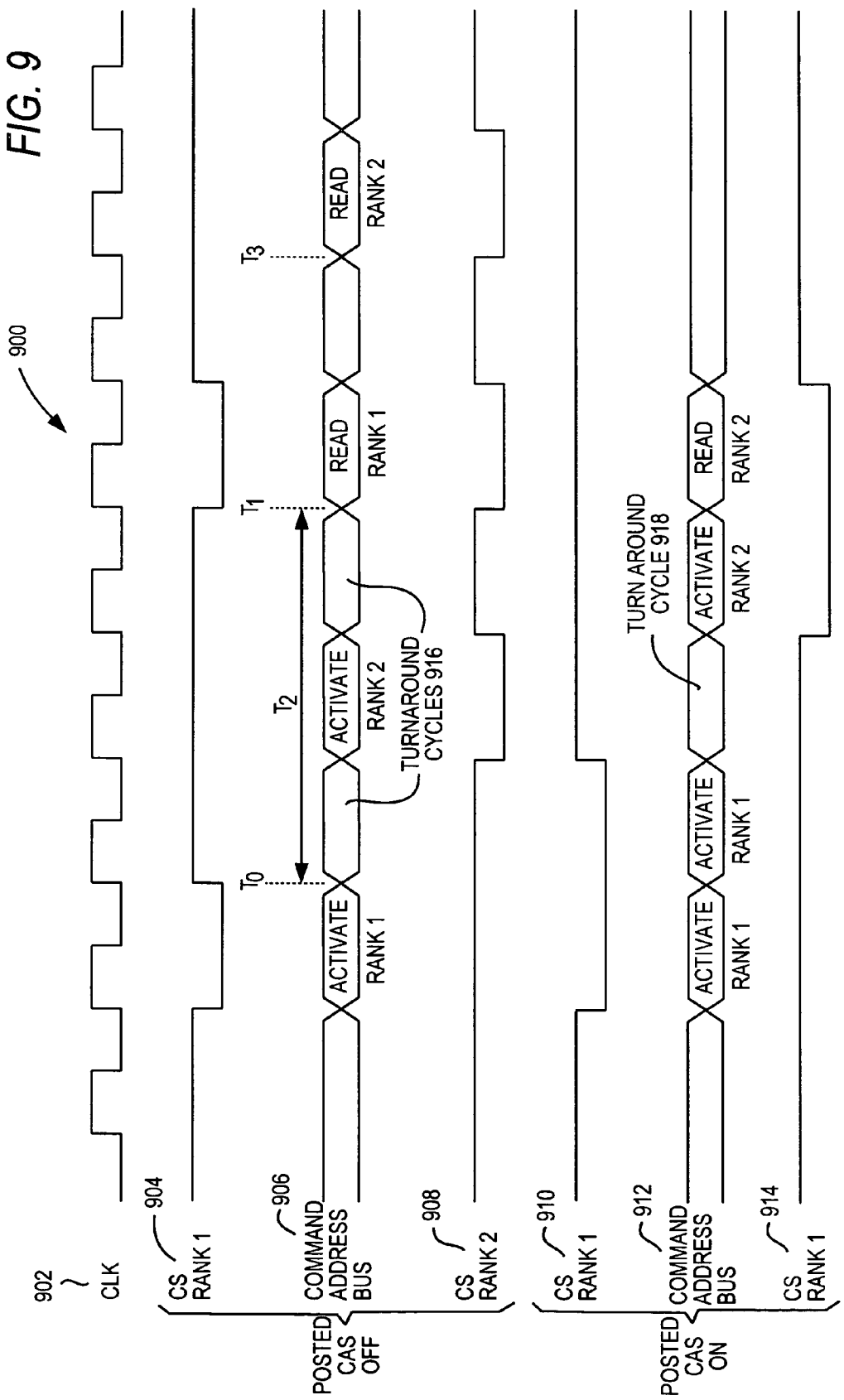
FIG. 9 is a timing diagram of signals also between a memory controller and memory modules.

FIG. 9 illustrates the use of posted CAS accesses. Timing diagram 900 illustrates the timing of signals on the command address bus and chip select signals with and without the use of posted accesses. As shown in timing diagram 900, bank activate command to activate a bank from a first rank of devices is followed by a read command to that bank at $T_1$, as illustrated by command address bus signals 906. Time interval $T_2$ between the activate command and the read command has to be greater than the $t_{RCD}$ parameter for the memory devices that are accessed. Timing diagram 900 of FIG. 9 illustrates a memory device that has a $t_{RCD}$ parameter of at least three clock cycles ($T_2$). An activate command to a bank in a second rank of devices can be issued in time interval $T_2$ using command address bus 906 after sufficient time has elapsed to allow the command address bus to settle (turnaround cycles 916). At $T_1$, a read command for the bank in the first rank that has been activated can be issued on, command address bus 906. At $T_3$, a read command for the bank in the second rank that has been activated can be issued on command address bus 906. Chip select signal CS 904 is active for the corresponding time intervals that commands to the first rank of memory devices are issued and chip select CS 908 is active for the corresponding time intervals that commands to the second rank of memory devices are issued and chip select. As shown by timing diagram 900 of FIG. 9, two activate and two read commands to two ranks of memory devices take at least seven clock cycles without the use of posted CAS accesses.

Timing diagram 900 of FIG. 9 also illustrates posted CAS accesses on the command address bus. By using posted CAS accesses, a read command to a first rank of memory devices is issued on command address bus 912 some time before $T_1$, i.e., before time interval $t_{RCD}$ has elapsed. The number of cycles that a read command is issued on the command address bus in advance of when a memory device posts or sends the read command internally can be determined by how the memory device is programmed with respect to its posted CAS access feature. As shown by command address bus 912, the read command to a first rank of memory devices can be issued three cycles in advance of when the memory device can accept the read command internally. Command address bus 912 also illustrates the issuance of a read command to a second rank of memory devices in advance in advance of when the memory device can accept the read command internally. Thus, when memory devises are configured to use posted CAS access, the read command and the activate command to a specific rank of memory devices are advantageously scheduled without intervening commands to a different rank of devices. As shown by timing diagram 900 of FIG. 9, two activate and two read commands to two ranks of memory devices take at least five clock cycles with the use of posted CAS accesses, which is two cycles less than a similar sequence of commands without the use of posted CAS accesses. Although FIG. 9 illustrates the timing of the command address bus with respect to activate and read commands, the timing of the command address bus is substantially identical for write accesses.

In accordance with the invention, the number of ranks used in a computer system can be increased by using switches to limit the loading of the command address bus seen by the memory controller. The switches advantageously limit loading of the command address bus by effectively driving command address bus signals only to memory devices of a selected rank. Embodiments of the invention are not limited to SDRAM-based devices, and may include other types of memory devices that are configured to share a single command address bus, wherein overloading of the command address bus can be alleviated by using switches in accordance with the invention.

Figure 10:
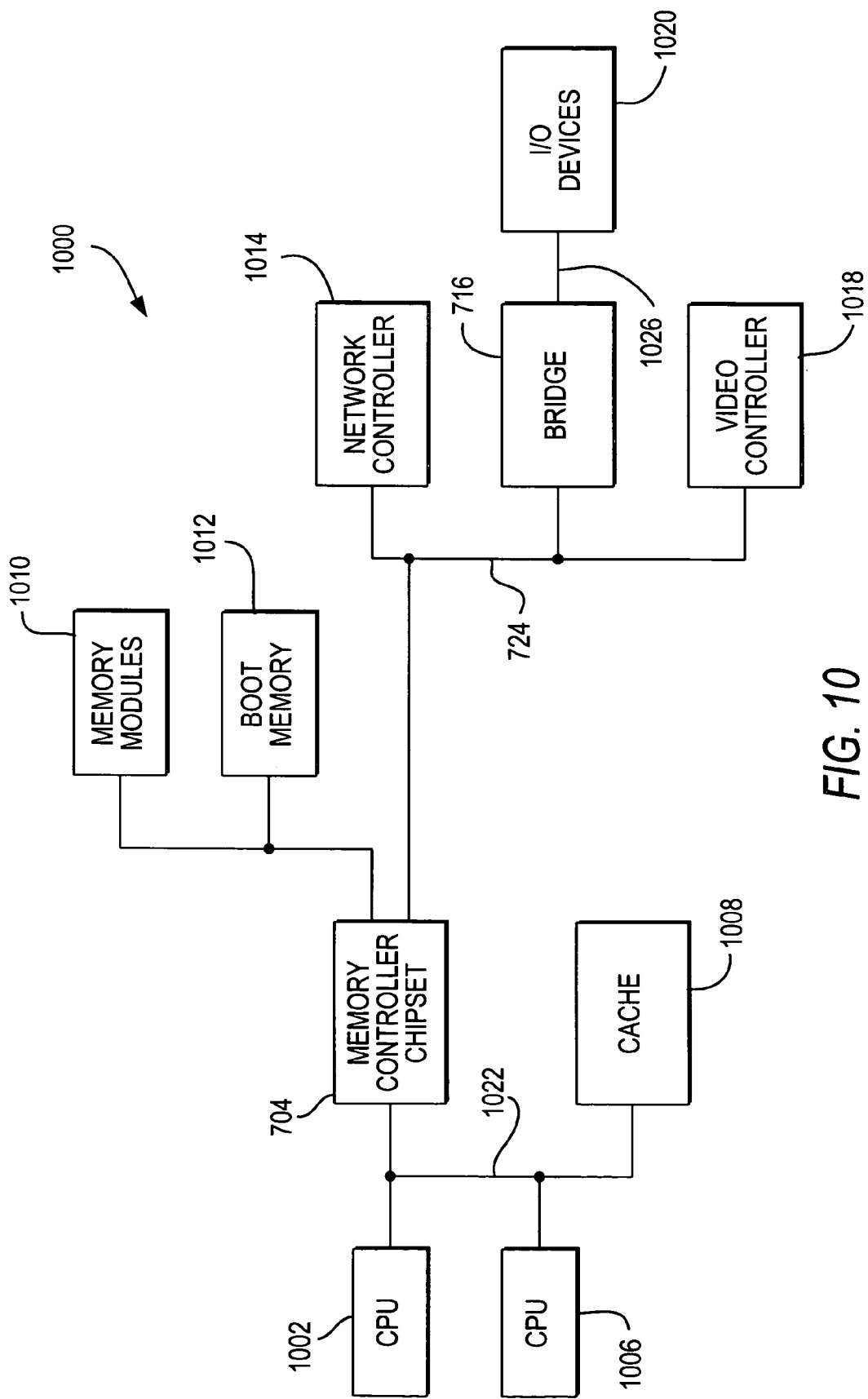
FIG. 10 is a block diagram of a computer system incorporating the invention.

FIG. 10 shows computer system 1000 that includes a memory configuration in accordance with the invention. The components of computer system 1000 are merely illustrative and should in no way limit the number and type of components that can be used in a computer system in accordance with the invention. The components of computer system 1000 can be incorporated in one or more integrated devices, and some components may be incorporated in the same integrated devices. Moreover, other computer system components not shown can also be included. Computer system 1000 includes one or more CPUs 1002 and 1006, which are coupled to memory controller/chipset 1004 and cache 1008. Memory controller/chipset 1004 can provide memory interface 1022 such that memory modules 1010 and boot memory 1012 can be accessed by CPU 1002 and 1006 through memory controller/chipset 1004. Either memory controller 1004 or memory modules 1010 include switches for isolating the command address bus in accordance with the invention. Memory controller/chipset 1004 can also provide PCI (peripheral component interconnect) bus 1024, to which network controller 1014, bridge 1016, and video controller 1018 can be coupled. Bridge 1016 can be used to couple I/O devices 1020 (e.g., a modem circuit) to CPU 1002 and 1006 by providing connectivity between PCI bus 1024 and I/O bus 1026.

Thus it is seen that the number of memory modules and the number of ranks of memory devices connectable to a memory controller can be increased by providing switches that isolate the command address bus from the memory modules. One skilled in the art will appreciate that the invention can be practiced by other than the described embodiments, which are presented for purposes of illustration and not of limitation, and the invention is limited only by the claims which follow.

I claim:
1. A memory system comprising:
    a memory controller coupled to a first and a second bus switch, wherein:
        said memory controller provides a first chip select signal to said first bus switch and a second chip select signal to said second bus switch,
        said memory controller provides command address bus signals to said first and second bus switches, wherein said memory controller is synchronized, by sending said command address bus signals early relative to the first and second chip select signals, to compensate for propagation delay added to said command address bus signals by said first and second bus switches, and
        each of said first and second bus switches has an ON state and an OFF state, only one of said first and second switches being in the ON state at a time, wherein said first and second bus switches are selected to be in the ON state respectively by said first and second chip select signals; and
    a first dual in-line memory module coupled to said command address bus signals via said first switch and a second dual in-line memory module coupled to said command address bus signals via said second switch, wherein:
        when a respective one of said first and second switch is in the ON state, said respective one of said first and second switches provides the command address bus signals to a respective one of said first and second dual in-line memory modules, and
        when a respective one of said first and second switch is in the OFF state, said respective one of said first and second switches isolates the command address bus signals from a respective one of said first and second dual in-line memory modules.

2. The memory system of claim 1, wherein said memory controller provides at least one of said first and second chip select signals to a respective one of said first and second dual in-line memory modules.

3. The memory system of claim 2, wherein the respective one of the first and second dual in-line memory modules performs a read or write function only when selected by the one of the first and second chip select signals.

4. The memory system of claim 1, wherein each of said first and second dual in-line memory modules comprises double data rate memory circuitry.

5. The memory system of claim 1, wherein each of the first and second dual in-line memory modules comprises a plurality of ranks of memory devices.

6. The memory system of claim 5, wherein one of said first and second switches is selected to be in the ON state when a respective one of said first and second chip select signals corresponds to any one of said ranks of memory devices in said respective one of said first and second dual in-line memory modules.

7. The memory system of claim 1, further comprising:
a first set of signal paths that each originate from said memory controller adapted to provide said first chip select signal to said first bus switch and said second chip select signal to said second bus switch; and
a second set of signal paths that each originate from said memory controller adapted to provide said first chip select signal to said first dual in-line memory module and said second chip select signal to said second dual in-line memory module.

8. The memory system of claim 7, wherein the first set of signal paths is disjoint from the second set of signal paths.

9. The memory system of claim 1, wherein:
said memory controller comprises a first chip select signal output adapted to provide said first chip select signal, and a second chip select signal output adapted to provide said second chip select signal;
said first bus switch comprises a first field effect transistor adapted to receive said command address bus signals and said second bus switch comprises a second field effect transistor adapted to receive said command address bus signals; and
said first chip select output is connected to said first field effect transistor and said second chip select output is connected to said second field effect transistor.

10. The memory system of claim 9, wherein:
said memory controller further comprises a command address bus output adapted to provide said command address bus signals; and
said first field effect transistor is connected to said command address bus output and said second field effect transistor connected to said command address bus output.

11. A memory system comprising:
a memory module comprising a plurality of ranks of memory devices; and
a bus switch coupled to said memory module, wherein:
said bus switch receives a command address bus from a memory controller and an output enable signal from a logic gate, said logic gate combining a plurality of chip select signals,
said bus switch provides said command address bus to said memory module when said output enable signal is in a first state,
said bus switch isolates the command address bus from said memory module when said output enable signal is in a second state, and
said memory controller is synchronized, by sending said command address bus signals early relative to the chip select signals, to compensate for propagation delay added to said command address bus signals by said bus switch.

12. The memory system of claim 11, wherein said output enable signal is placed in said first state when any one of said plurality of ranks of memory devices is selected by any one of said plurality of chip select signals.

13. The memory system of claim 11, wherein said memory controller provides a switch select signal to said bus switch, wherein said switch select signal controls the output of said bus switch independently from said output enable signal.

14. The memory system of claim 13, wherein said switch select signal control comprises enabling the bus switch to provide said command address bus to said memory module and isolating said command address bus from said memory module.

15. The memory system of claim 13, wherein each of said switch select signal and said output enable signal is provided to said bus switch substantially at the same time.

16. The memory system of claim 13, further comprising logic circuitry for combining said switch select signal with another switch select signal.

17. The memory system of claim 11, wherein said memory module comprises double data rate memory circuitry.

18. A computer system comprising:
a central processing unit comprising a memory interface, wherein said memory interface comprises command address bus signals;
a memory controller coupled to said central processing unit via said memory interface;
a plurality of memory modules; and
a plurality of switching circuits respectively coupled to each of said plurality of memory modules and to said command address bus signals, wherein:
each of said switching circuits receives said command address bus signals and a chip select signal, said chip select signal indicating selection of a corresponding one of said memory modules for coupling to said memory interface;
each of said switching circuits outputs said command address bus signals to said corresponding one of said memory modules when said corresponding chip select signal indicates selection of said corresponding one of said memory modules for coupling to said memory interface; and
said central processing unit has programmable latency as to commands provided to said memory modules, said programmable latency compensating for propagation delay added to command address bus signals by said switching circuits by sending said command address bus signals early relative to the chip select signal.

19. The computer system of claim 18, wherein at least one of said memory modules comprises a plurality of memory ranks, wherein:
said switching circuits are respectively coupled to each of said plurality of memory ranks on said one of said memory modules; and
said chip select signal further indicates selection of a corresponding one of said memory ranks on said one of said memory modules for output of said command address bus signals to said corresponding one of said memory ranks.

20. The computer system of claim 18 further comprising:
a cache coupled to said central processing unit via said memory interface; and
a boot memory coupled to said memory controller, wherein said memory controller couples said memory interface to said boot memory.

21. The computer system of claim 18 further comprising a peripheral component interconnect bus, wherein said peripheral component interconnect bus couples said memory controller to a plurality of peripheral components.

22. The computer system of claim 21, wherein one of said plurality of peripheral components is a network controller or a video controller.

23. The computer system of claim 21, one of said peripheral components comprises a bridge for coupling said memory controller to a plurality of I/O devices.

24. The computer system of claim 23, wherein one of said plurality of I/O devices comprises a modem circuit.

25. The computer system of claim 23, wherein at least one of said plurality of memory modules comprises double data rate memory circuitry.

26. The computer system of claim 23, wherein said memory controller includes said switching circuits.

27. The computer system of claim 18, wherein at least one of said memory modules includes said switching circuits.

28. A computer system comprising:
a central processing unit;
a memory controller coupled to said central processing unit;
a command address bus coupled to said memory controller;
a plurality of double data rate memory modules each of modules comprising a plurality of memory ranks, each rank comprising:
a memory array, a row decoder, and
a column decoder;
a plurality of switches, each switch coupled between said command address bus and a respective memory rank of said plurality of memory ranks; and
a plurality of signal lines, each signal line coupled between said memory controller and a respective switch of said plurality of switches, wherein:
one or more signals that select one of said memory ranks for memory array access are transmitted via said signal lines;
each switch transfers command address signals between said command address bus and each said switch's respective memory rank in response to selection of that memory rank for memory array access, only one said switch transferring said command address signals at a time; and
said central processing unit has programmable latency as to commands provided to said memory ranks, said programmable latency compensating for propagation delay added to command address bus signals by said plurality of switches by sending said command address bus signals early relative to a chin select signal.

29. The computer system of claim 28 wherein said memory controller is synchronized to receive data provided by a selected memory rank during a read access, said synchronization accounting for signal propagation delay through said selected memory rank's respective switch.

30. The computer system of claim 28 wherein said memory controller is synchronized to provide data to a selected memory rank during a write access, said synchronization accounting for signal propagation delay through said selected memory rank's respective switch.

31. The computer system of claim 28 wherein said command address signals comprise at least one signal from the group consisting of address signals, row access strobe signals, column address strobe signals, and array select signals.

32. A computer memory system comprising:
a plurality of double data rate memory arrays;
a memory controller having programmable signal latency for receiving data from and providing data to said double data rate memory arrays;
a command address bus coupled to said memory controller; and
a plurality of switches, each switch coupled between said command address bus and a respective double data rate memory array, each switch having a closed state for transferring signals between said bus and respective double data rate memory array and an open state for preventing transfer of signals between said bus and respective double data rate memory array; wherein:
said memory controller is operative to:
select one of said double data rate memory arrays to receive data from or provide data to,
close said selected double data rate memory array's respective switch, and
open all other said switches, preventing transfer of signals from said command address bus to non-selected double data rate memory arrays;
wherein said programmable latency compensates for propagation delay added to said command address bus signals by said plurality of switches by sending said command address bus signals early relative to the chip select signals.

33. The computer system of claim 32 wherein said switches comprise N-channel field effect transistors.

34. A computer memory system comprising:
a command address bus;
a memory controller comprising a plurality of switches, each switch coupled to said command address bus, wherein said memory controller is synchronized, by sending said command address bus signals early relative to a chip select signal, to compensate for propagation delay added to said command address bus signals by said bus switches; and
a double data rate memory module comprising a plurality of memory ranks, each rank coupled to a respective switch of said memory controller, each rank comprising:
a memory array,
a row decoder, and
a column decoder; wherein:
each switch transfers command address signals between said command address bus and each said switch's respective memory rank in response to selection of that memory rank for memory array access by said memory controller.

35. The system of claim 34, wherein said memory controller has programmable latency with respect to commands provided to said memory ranks during respective write and read accesses to said memory ranks.

36. The system of claim 34, wherein said switches comprise N-channel field effect transistors.

37. The system of claim 34, wherein said command address signals comprise at least one signal selected from the group consisting of address signals, row access strobe signals, column address strobe signals, and rank select signals.

38. A computer system comprising:
a double data rate memory module comprising a plurality of ranks of memory circuits;
a plurality of switching circuits respectively coupled to said plurality of ranks of memory circuits;
a command address bus coupled to said plurality of switching circuits; and
a central processing unit coupled to said plurality of ranks of memory circuits via said command address bus and said switching circuits, wherein said central processing unit has programmable latency as to commands provided to said memory circuits during write accesses to said memory circuits, said programmable latency compensating for propagation delay added to command address bus signals by said switching circuits by sending said command address bus signals early relative to a chin select signal; wherein:
each of said switching circuits receives said command address bus signals and said chip select signal, said chip select signal indicating selection of a corresponding one of said ranks of memory circuits for access by said central processor unit; and each of said switching circuits outputs said command address bus signals to said corresponding one of said ranks of memory circuits when said corresponding chip select signal indicates selection of said corresponding one of said ranks of memory circuits for access by said central processor unit.

39. The computer system of claim 38, wherein said central processing unit has programmable latency as to commands provided to said memory circuits during read accesses to said memory circuits, said programmable latency compensating for propagation delay added to said command address bus signals by said switching circuits.

40. The computer system of claim 38, wherein said switching circuits are located on a same circuit board as said corresponding one of said double data rate ranks of memory circuits.

41. The computer system of claim 38, wherein said command address bus signals comprise at least one signal selected from the group consisting of address signals, row access strobe signals, column address strobe signals, and rank select signals.

* * * * *

UNITED STATES PATENT AND TRADEMARK OFFICE
CERTIFICATE OF CORRECTION

PATENT NO. : 7,673,094 B2 Page 1 of 1
APPLICATION NO. : 11/592944
DATED : March 2, 2010
INVENTOR(S) : Paul A. LaBerge It is certified that error appears in the above-identified patent and that said Letters Patent is hereby corrected as shown below:

In column 13, line 39, in Claim 28, delete "chin" and insert -- chip --, therefor.

In column 14, line 61, in Claim 38, delete "chin" and insert -- chip --, therefor.

Signed and Sealed this

Twenty-fifth Day of May, 2010

David J. Kappos
*Director of the United States Patent and Trademark Office*